United States Patent
Nemoto et al.

(10) Patent No.: US 8,796,820 B2
(45) Date of Patent: Aug. 5, 2014

(54) SEMICONDUCTOR WAFER AND SEMICONDUCTOR DEVICE WAFER

(75) Inventors: Shusei Nemoto, Hitachi (JP); Hisashi Mashiyama, Hitachinaka (JP)

(73) Assignee: Hitachi Metals, Ltd., Tokyo (JP)

( * ) Notice: Subject to any disclaimer, the term of this patent is extended or adjusted under 35 U.S.C. 154(b) by 165 days.

(21) Appl. No.: 13/356,799

(22) Filed: Jan. 24, 2012

(65) Prior Publication Data

US 2012/0187547 A1    Jul. 26, 2012

(30) Foreign Application Priority Data

Jan. 25, 2011 (JP) .................. 2011-013071

(51) Int. Cl.
*H01L 29/06* (2006.01)
(52) U.S. Cl.
USPC ........................................................ 257/618
(58) Field of Classification Search
USPC .................. 257/618, 622, 620, 623
See application file for complete search history.

(56) References Cited

U.S. PATENT DOCUMENTS

| 2010/0001376 A1 | 1/2010 | Takamizawa et al. |
| 2011/0140244 A1* | 6/2011 | Schwarzenbach et al. ... 257/618 |

FOREIGN PATENT DOCUMENTS

| JP | 2006-040994 A | 2/2006 |
| JP | 2008-156189 A | 7/2008 |

* cited by examiner

*Primary Examiner* — Hoa B Trinh
(74) *Attorney, Agent, or Firm* — McGinn IP Law Group, PLLC

(57) ABSTRACT

A semiconductor wafer having a disc shape includes a chamfer provided around a circumferential edge of the wafer, and an anti-cracking and chipping groove provided in one or more areas around one circumference of an end face of the wafer along a circumferential direction of the end face. The anti-cracking and chipping groove is configured to prevent cracking or chipping of the end face in back grinding.

17 Claims, 6 Drawing Sheets

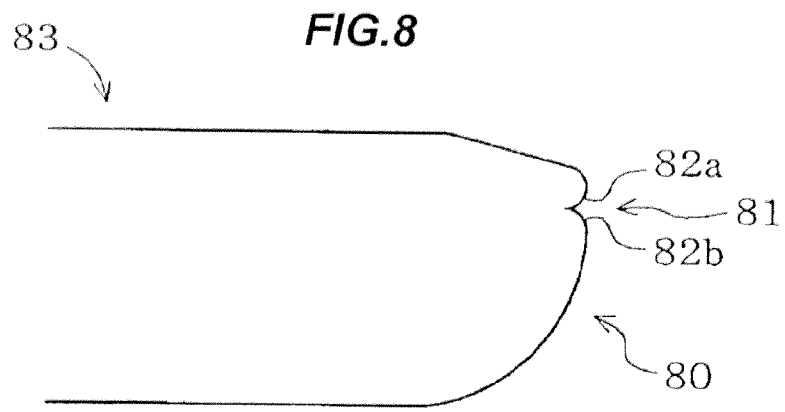
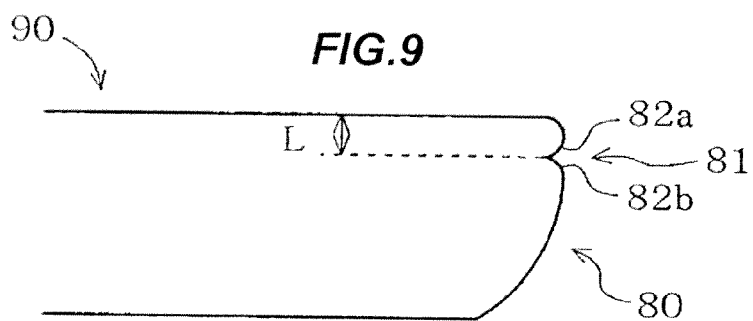
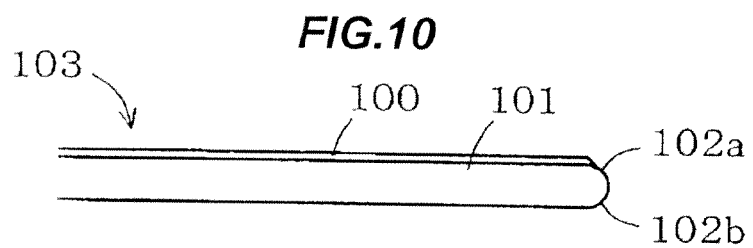
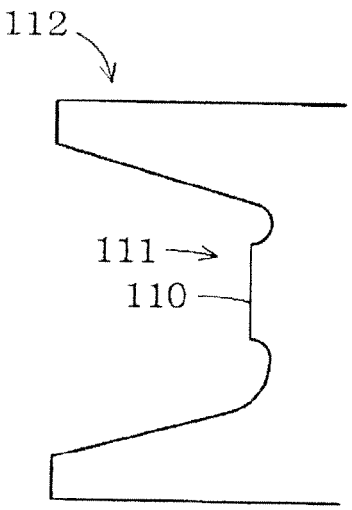

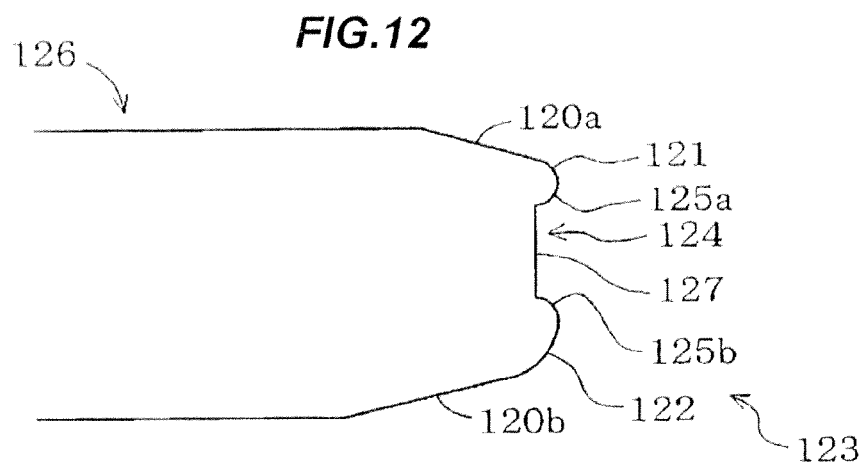
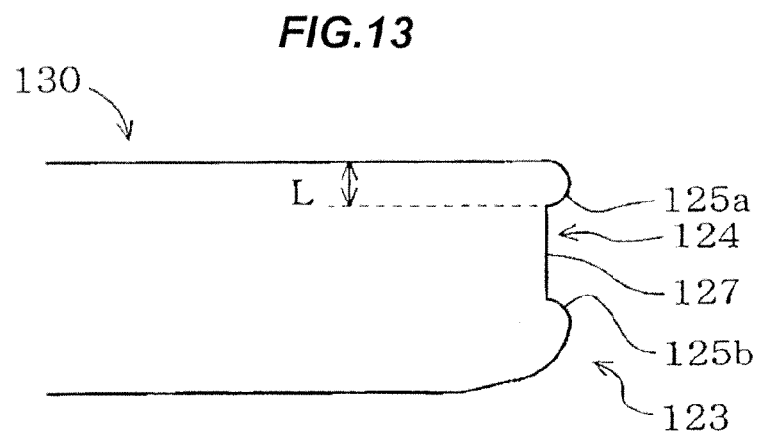
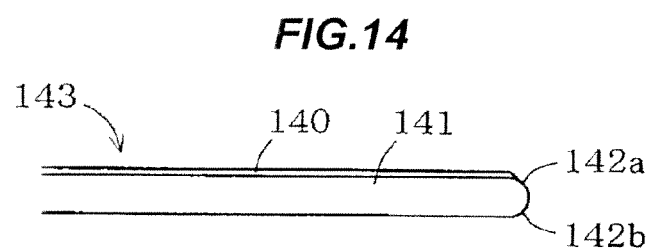
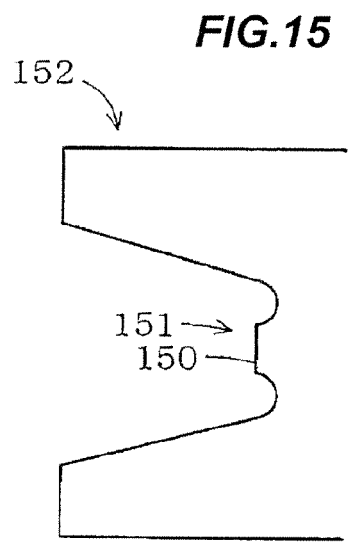

SEMICONDUCTOR WAFER AND SEMICONDUCTOR DEVICE WAFER

The present application is based on Japanese patent application No. 2011-013071 filed on Jan. 25, 2011, the entire contents of which are incorporated herein by reference.

BACKGROUND OF THE INVENTION

1. Field of the Invention

This invention relates to a disc-shaped semiconductor wafer and a disc-shaped semiconductor device wafer, which are provided with a chamfer around a circumferential edge thereof.

2. Description of the Related Art

Referring to FIG. 22, a general semiconductor wafer 220 is a disc-shaped semiconductor wafer provided with chamfers around front surface side and back surface side circumferential edges, respectively, of the wafer.

Herein, a general production process for the semiconductor wafer 220 such as GaAs or the like is described.

First, a grown semiconductor crystal is surface ground, shaped into a cylinder, and sliced with an inner diameter saw or a wire saw into a specified thickness wafer shape, to provide a disc-shaped as-sliced wafer.

Thereafter, to prevent cracking or chipping of an end face of the as-sliced wafer, the as-sliced wafer is chamfered with a wafer end face grinder (chamfering machine). In particular, when the size of the as-sliced wafer is not more than 125 mm in diameter, a circumferential edge thereof including an orientation flat (herein referred to as "OF") and an index flat (herein referred to as "IF") is chamfered by use of a grindstone or the like, and when the size of the as-sliced wafer is not less than 150 mm in diameter, a circumferential edge thereof including a notch is chamfered by use of a grindstone or the like.

Following the above process, the wafer is lapped or flat surface ground for enhancement in flatness, and is etched for affected layer removal and cleaning. After the etching, the wafer is double-side ground so that both a front surface and a back surface thereof are mirrored surfaces having a high flatness. This double-side grinding is performed by use of typically a nonwoven polishing cloth.

Thereafter, the front surface of the wafer is polished to a mirror finish by use of a foamed polyurethane soft polishing cloth. Following that, the wafer is washed and finally dried, resulting in the semiconductor wafer 220.

The purpose of the previously described chamfering is to prevent the occurrence of chipping or cracking of the end face 221 of the semiconductor wafer 220, in the subsequent polishing step and in a device manufacturing process.

Particularly in the device manufacturing, for the purpose of reducing the device size, a semiconductor device wafer 231 as shown in FIG. 23 may be manufactured by forming a device structure layer 230 such as a semiconductor epitaxial layer on the front surface of the semiconductor wafer 220, and thereafter grinding the back surface side of the semiconductor wafer 220, the properties of which are unaffected by the back grinding. In FIG. 23, a portion indicated by a dotted line shows a portion to be removed by back grinding. The thickness of the semiconductor wafer 220 may finally be reduced to around 100 µm.

In this case, if the chamfer has the shape as shown in FIG. 22, the end face 221 of the semiconductor wafer 220 is shaped at an acute angle in accordance with the reduction in thickness of the semiconductor wafer 220. As a result, the end face 221 of the semiconductor wafer 220 tends to be subject to excessive stress. This causes the chipping or cracking of the end face 221 of the semiconductor wafer 220.

In view of this point, there has been suggested a semiconductor wafer devised so that the end face 221 after the back grinding (back lapping) has no acute angle shape.

For example, Japanese Patent Laid-Open No. 2006-40994 (JP-A-2006-40994) suggested a semiconductor wafer, in which an end face is sloped at an acute angle with respect to a front surface of the wafer and at an obtuse angle with respect to a back surface of the wafer, and the end face of the wafer is chamfered around a front surface circumferential edge and a back surface circumferential edge, respectively.

According to this structure, the end face of the wafer after the back grinding in device manufacturing can be shaped into a quasi circular arc, as if chamfered, so that the occurrence of chipping or cracking of the end face of the wafer can be reduced.

Japanese Patent Laid-Open No. 2008-156189 (JP-A-2008-156189) discloses a conventional nitride semiconductor freestanding substrate and a method for fabricating the same.

SUMMARY OF THE INVENTION

However, in the semiconductor wafer disclosed by JP-A-2006-40994, the end face in vicinity of the front surface of the wafer has a significantly acute angle shape prior to the back grinding. Therefore, when handled with vacuum tweezers or the like, or when contacted with a wafer tray or the like, the end face of the wafer tends to be subject to the excessive stress and tends to chip or crack.

Also, even if the back grinding can be performed without the occurrence of chipping or cracking, the wafer end face and the wafer front surface side after the back grinding will have a round shape. However, the wafer back surface side is only flat-chamfered. Accordingly, there still remains a possibility of the occurrence of chipping or cracking.

Also, in a semiconductor wafer disclosed by JP-A-2008-156189, a groove is formed in a center of an end face of a thick film wafer having more than twice the thickness of the wafer, and slicing the thick film wafer from the groove into two halves.

This groove formed in the wafer end face is configured not for preventing the occurrence of chipping or cracking, but for guiding a tool for slicing the thick film wafer into two halves in a diametrical direction. Further, since JP-A-2008-156189 does not specifically defines the depth, shape and the like of the groove, and the wafer end face after slicing is provided with a non-chamfered portion, this semiconductor wafer will have such a shape that chipping or cracking tends to occur.

In view of the foregoing, it is an object of the present invention to provide a semiconductor wafer and a semiconductor device wafer, in which an end face after back grinding in device manufacturing has an ideal round chamfer shape, and that are not likely to chip or crack and capable of remarkably improving the device manufacturing yield.

According to a feature of the invention, a semiconductor wafer having a disc shape, comprises:

a chamfer provided around a circumferential edge of the wafer; and an anti-cracking and chipping groove provided in one or more areas around one circumference of an end face of the wafer along a circumferential direction of the end face.

The anti-cracking and chipping groove may be configured to prevent cracking or chipping of the end face in back grinding.

The semiconductor wafer may further comprise:

chamfers provided around boundaries, respectively, between the anti-cracking and chipping groove and the end face of the wafer.

The chamfer provided around the circumferential edge of the wafer may comprise a chamfer provided around a front surface circumferential edge of the wafer, and each of the chamfer provided around the front surface circumferential edge of the wafer and the chamfers provided around the boundaries between the anti-cracking and chipping groove and the end face of the wafer preferably includes a round chamfer having a curvature radius of not less than 20 μm and not more than 100 μm.

The chamfer provided around the circumferential edge of the wafer may comprise a chamfer formed around a back surface circumferential edge of the wafer, and the chamfer provided around the back surface circumferential edge of the wafer preferably includes a round chamfer having a curvature radius of not less than 20 μm and not more than 1000 μm.

The anti-cracking and chipping groove in an area adjacent to a front surface of the wafer is preferably located at a position where a wafer front surface boundary between the anti-cracking and chipping groove and the end face of the wafer becomes a wafer back surface circumferential edge after back grinding.

The anti-cracking and chipping groove in the area adjacent to the front surface of the wafer is preferably located at a position where the thickness of the wafer after the back grinding is not less than 40 μm and not more than 200 μm.

The anti-cracking and chipping groove is preferably not less than 20 μm and not more than 200 μm in depth.

According to another feature of the invention, a semiconductor device wafer comprises:

a semiconductor wafer including a front surface, a back surface, and a side surface, the back surface of the semiconductor wafer being ground; and a device structure layer provided over the front surface of the back surface ground semiconductor wafer;

in which the side surface of the back surface ground semiconductor wafer is provided with a chamfer having a curvature radius of $R_d$ (μm) satisfying $(1/2)t \leq R_d \leq (3/5)t$, where a thickness of the back surface ground semiconductor wafer is t (μm).

According to a still another feature, a semiconductor device wafer comprises:

a semiconductor wafer including a front surface, a back surface, and a side surface, the back surface of the semiconductor wafer being ground; and a device structure layer provided over the front surface of the back surface ground semiconductor wafer;

in which the side surface of the back surface ground semiconductor wafer includes a front surface boundary with a first chamfer, a back surface boundary with a second chamfer, and an end provided between the front surface boundary and the back surface boundary, and the first chamfer and the second chamfer have a curvature radius of $R_d$ (μm) satisfying $(1/10)t \leq R_d \leq (1/2)t$, where a thickness of the back surface ground semiconductor wafer is t (μm), and the end has a curvature radius larger than the $R_d$ (μm).

(Points of the Invention)

According to the first feature of the invention, the anti-cracking and chipping groove is provided in one or more areas around one circumference of the end face of the wafer in the circumferential direction of the end face. This allows the end face of the back surface ground wafer to have the optimal round chamfered shape, be not likely to chip or crack, and remarkably improve the device manufacturing yield.

According to the second feature of the invention, the side surface of the back surface ground semiconductor wafer is provided with the chamfer having the curvature radius of $R_d$ (μm) satisfying $(1/2)t \leq R_d \leq (3/5)t$ where the thickness of the back surface ground semiconductor wafer is t (μm). This configuration makes it possible to suppress the occurrence of cracking or chipping.

According to the third feature of the invention, the side surface of the back surface ground semiconductor wafer includes the front surface boundary with the first chamfer, the back surface boundary with the second chamfer, and the end provided between the front surface boundary and the back surface boundary, and the first chamfer and the second chamfer have the curvature radius of $R_d$ (μm) satisfying $(1/10)t \leq R_d \leq (1/2)t$ where the thickness of the back surface ground semiconductor wafer is t (μm), and the end has the curvature radius larger than the $R_d$ (μm). This configuration makes it possible to suppress the occurrence of cracking or chipping.

BRIEF DESCRIPTION OF THE DRAWINGS

The preferred embodiments according to the invention will be explained below referring to the drawings, wherein:

FIG. 8 is a schematic diagram showing a cross section of a wafer provided with a groove after groove formation in Example 1;

FIG. 9 is a schematic diagram showing a cross section of a double side ground semiconductor wafer in Example 1;

FIG. 10 is a schematic diagram showing a cross section of a back surface ground semiconductor device wafer during device manufacturing in Example 1;

FIG. 11 is a schematic diagram showing a cross section of a grindstone for forming a chamfer and a groove in Example 2;

FIG. 12 is a schematic diagram showing a cross section of a wafer provided with a groove after the chamfer and groove formation in Example 2;

FIG. 13 is a schematic diagram showing a cross section of a double side ground semiconductor wafer in Example 2;

FIG. 14 is a schematic diagram showing a cross section of a back surface ground semiconductor device wafer during device manufacturing in Example 2;

FIG. 15 is a schematic diagram showing a cross section of a grindstone for forming a chamfer and a groove in Example 3;

DETAILED DESCRIPTION OF THE PREFERRED EMBODIMENTS

Below are described preferred embodiments according to the invention, in conjunction with the accompanying drawings.

(Semiconductor Wafers 10, 20, and 30)

Figure 1:
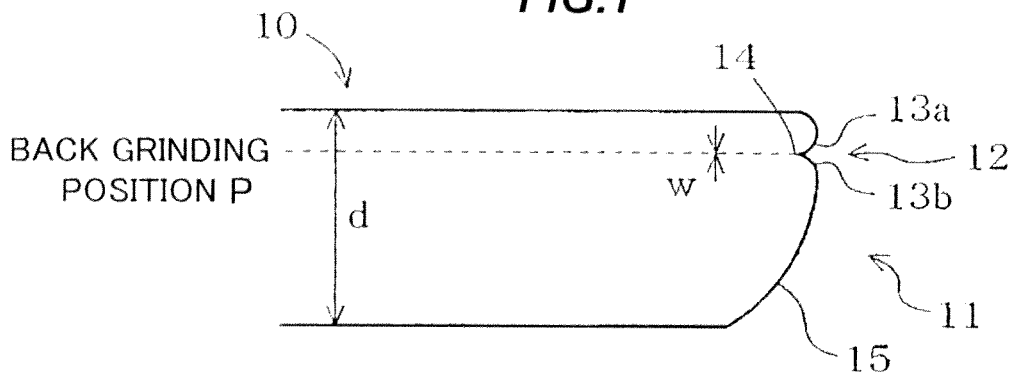
FIG. 1 is a schematic diagram showing a cross section of a semiconductor wafer according to the invention.
Figure 2:
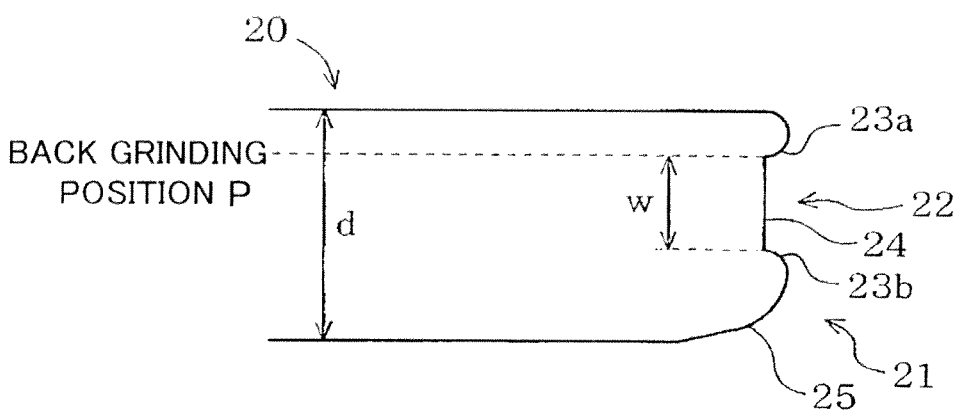
FIG. 2 is a schematic diagram showing a cross section of a semiconductor wafer according to the invention.
Figure 3:
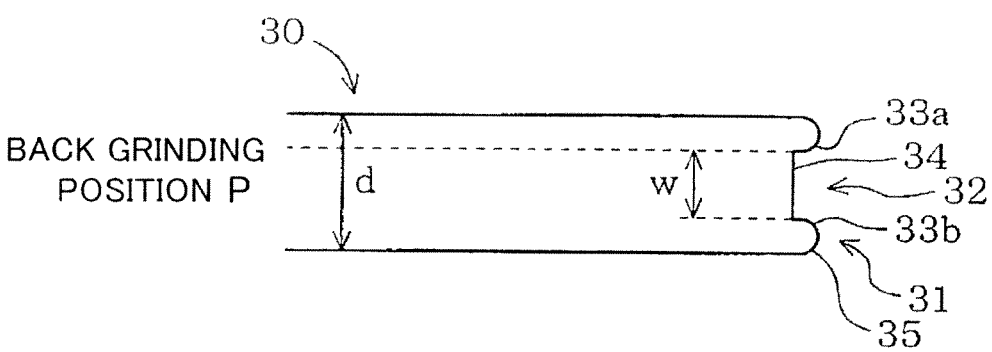
FIG. 3 is a schematic diagram showing a cross section of a semiconductor wafer according to the invention.

Referring to FIGS. 1 to 3, there are shown schematic diagrams showing cross sections of typical semiconductor wafers 10, 20, and 30, respectively, according to the invention.

As shown in FIGS. 1 to 3, the typical semiconductor wafers 10, 20, and 30 according to the invention are disc-shaped semiconductor wafers provided with a chamfer around a circumferential edge thereof, and are each characterized by being provided with an anti-cracking and chipping groove 12, 22, or 32 in one or more areas in a circumferential direction of a wafer end face 11, 21, or 31 and around one circumference thereof, to prevent cracking or chipping of the wafer end face 11, 21, or 31 in back grinding.

The semiconductor wafers 10, 20, and 30 are each manufactured as follows: First, a grown semiconductor crystal is surface ground, shaped into a cylinder, and sliced with an inner diameter saw or a wire saw into a specified thickness wafer shape, to provide a disc-shaped as-sliced wafer.

Thereafter, the as-sliced wafer is provided with a chamfer around a circumferential edge thereof, and further or simultaneously, the as-sliced wafer is provided with the anti-cracking and chipping groove 12, 22, or 32 in one or more areas in the circumferential direction of the wafer end face 11, 21, or 31 and around one circumference thereof.

Finally, a front surface of the as-sliced wafer provided with the anti-cracking and chipping groove 12, 22, or 32 is polished to a mirror finish, resulting in the semiconductor wafer 10, 20, or 30.

The resulting semiconductor wafers 10, 20, and 30 are supplied to a device manufacturing process.

Figure 4:
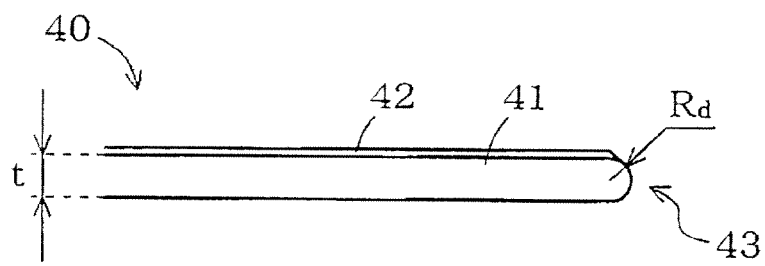
FIG. 4 is a schematic diagram showing a cross section of a semiconductor device wafer manufactured using the semiconductor wafers of FIGS. 1 to 3.

Referring to FIG. 4, in the device manufacturing process, the semiconductor wafers 10, 20, and 30 are each provided with a device structure layer 42 over its front surface, such as a semiconductor epitaxial layer and the like, and thereafter are each back surface ground to a specified back grinding position P, each resulting in a semiconductor device wafer 40 provided with the device structure layer 42 over the back surface ground semiconductor wafer 41 (herein also referred to as "the back surface ground wafer 41"). The configuration of this semiconductor device wafer 40 will be described later. Thereafter, the semiconductor device wafer 40 undergoes various steps, resulting in a semiconductor device.

A specific configuration of the semiconductor wafers 10, 20, and 30 according to the invention will be described below.

The semiconductor wafers 10, 20, and 30 is preferably formed of any one of Si, GaAs, GaN, AlN, GaP, InP, InSb, InAs, SiC, and sapphire.

The reason why the number of areas for forming the anti-cracking and chipping groove 12, 22, or 32 is one or more is as follows. In the device manufacturing process, the number of back grindings is not limited to one, but is assumed to be plural, to obtain an ideal chamfered shape to prevent chipping or cracking in each case of plural back grindings.

One example of the device manufacturing process with plural back grindings is given as follows. A semiconductor wafer is in turn provided with a first anti-cracking and chipping groove and a second anti-cracking and chipping groove at distances from a front surface of the wafer, and is mirror finished on the front surface of the wafer. A semiconductor epitaxial layer is grown over the semiconductor wafer, and the wafer is thereafter preliminarily back surface ground to the second anti-cracking and chipping groove, and further a device structure of insulating film, electrode, recess, etc. is processed and formed on the semiconductor epitaxial layer, and the wafer is thereafter back surface ground to the second anti-cracking and chipping groove.

Boundaries 13a and 13b, 23a and 23b, or 33a and 33b between the anti-cracking and chipping groove 12, 22, or 32 and the wafer end face 11, 21, or 31 are chamfered. Also, the anti-cracking and chipping groove 12, 22, or 32 in an area adjacent to the front surface of the wafer 10, 20, or 30 is formed at a position where the wafer front surface boundary 13a, 23a, or 33a between the anti-cracking and chipping groove 12, 22, or 32 and the wafer end face 11, 21, or 31 becomes the back surface circumferential edge of the semiconductor device wafer 40 after the back grinding.

The anti-cracking and chipping groove 12, 22, or 32 in the area adjacent to the front surface of the wafer 10, 20, or 30 is preferably formed at a position where the thickness of the back surface ground wafer 41 in the semiconductor device wafer 40 after the back grinding is not less than 40 μm and not more than 200 μm. Since the thinnest thickness of the semiconductor substrate wafers may be less than 10 to 40 μm after the back grinding in the device manufacturing, there is difficulty not only in making the anti-cracking and chipping groove 12, 22, or 32, but also in chamfering. In addition, even if the chamfering can be performed, the chamfer width is small. In this case, the chipping or cracking is highly likely to occur. For the aforementioned reasons, the lower limit of the thickness of the back surface ground wafer 41 in the semiconductor device wafer 40 after the back grinding is 40 μm. Also, since some of the back surface ground wafers may have a thickness of 200 μm, the upper limit of the thickness of the back surface ground wafer 41 in the semiconductor device wafer 40 after the back grinding is correspondingly 200 μm.

It is preferred that each of the chamfer around the front surface circumferential edge of the wafer 10, 20, or 30 and the chamfers around the boundaries 13a and 13b, 23a and 23b, or 33a and 33b, respectively, between the anti-cracking and chipping groove 12, 22, or 32 and the wafer end face 11, 21, or 31 include a round chamfer, whose curvature radius is not less than 20 μm and not more than 100 μm. Assuming that the thickness of the back surface ground wafer 41 in the semiconductor device wafer 40 after the back grinding in the device manufacturing is not less than 40 µm and not more than 200 µm and that the round chamfering which is considered most effective against the chipping or cracking is performed, the curvature radius is preferably set to be half the thickness of the back surface ground wafer 41 in the semiconductor device wafer 40 after the back grinding, i.e. not less than 20 µm and not more than 100 µm.

The depth of the anti-cracking and chipping groove 12, 22, or 32 is preferably not less than 20 µm and not more than 200 µm. The reason for setting the depth of the anti-cracking and chipping groove 12 to be not less than 20 µm is as follows. Assuming that the back surface ground wafer 41 in the semiconductor device wafer 40 after the back grinding is 40 µm thick at minimum as mentioned previously, and that the curvature radius of the round chamfering is then 20 µm, the minimum depth of the anti-cracking and chipping groove 12, 22, or 32 is set to be 20 µm similarly. Also, the Inventors found that when the anti-cracking and chipping groove 12, 22, or 32 is deeper than 200 µm, a portion above the anti-cracking and chipping groove 12, 22, or 32 is at high risk of chipping during the device manufacturing process. Therefore, the upper limit of the depth of the anti-cracking and chipping groove 12, 22, or 32 is defined to be 200 µm.

The width w at a bottom 14, 24, or 34 of the anti-cracking and chipping groove 12, 22, or 32 is preferably not more than (d−80 µm), where d is the thickness of the semiconductor wafer 10, 20, or 30. This is based on the following reason. Assuming that the back surface ground wafer 41 in the semiconductor device wafer 40 after the back grinding is 40 µm thick at minimum as mentioned previously, the front surface of the semiconductor wafer 10, 20, or 30 is 40 µm thick, and the back surface thereof is 40 µm thick, and the thickness (d−80 µm) that is obtained by subtracting the total thickness 80 µm of the front and back surfaces of the semiconductor wafer 10, 20, or 30 from the thickness d of the semiconductor wafer 10, 20, or 30 is the maximum value of the width w at the bottom 14, 24, or 34 of the anti-cracking and chipping groove 12, 22, or 32. The minimum value of the width w at the bottom 14, 24, or 34 of the anti-cracking and chipping groove 12, 22, or 32 depends on grindstone shape, but the ideal minimum value thereof is 0 µm (as shown in FIG. 1, for example). Therefore, the width w at the bottom 14, 24, or 34 of the anti-cracking and chipping groove 12, 22, or 32 is not more than (d−80 µm). The shape of the bottom 14, 24, or 34 of the anti-cracking and chipping groove 12, 22, or 32 is not particularly limited to a flat shape, but may be any shape, such as a U-shape, a projecting (convex) shape or the like, complying with the previously described conditions for the depth of the anti-cracking and chipping groove 12, 22, or 32 and the round shape of the round chamfers around the boundaries 13a and 13b, 23a and 23b, or 33a and 33b between the anti-cracking and chipping groove 12, 22, or 32 and the wafer end face 11, 21, or 31.

The chamfer 15, 25, or 35 around the back surface circumferential edge of the semiconductor wafer 10, 20, or 30 preferably includes a round chamfer, and the curvature radius of the round chamber is preferably not less than 20 µm and not more than 1000 µm. This is based on the following reason. The minimum chamfer width effective in the above described chamfering is considered to be 20 µm. Therefore, the curvature radius for the most effective round chamfering is set at not less than 20 µm. Also, the maximum value of the thickness of the practical as-sliced wafer after slicing is approximately 1000 µm in many cases. Therefore, assuming the round chamfering of the entire thickness of the as-sliced wafer, the curvature radius of the round chamfering is defined to be not more than 1000 µm.

The above described semiconductor wafer 10, 20, or 30 are used for fabricating the semiconductor device wafer 40, after the back side grinding is carried out from the back surface of the semiconductor wafer 10, 20, or 30 to the front surface boundary 13a, 23a, or 33a of the anti-cracking and chipping groove 12, 22, or 32. According to this process, the end face 11, 21, or 31, conventionally having an acute angle shape, of the back surface ground wafer 41 in the semiconductor device wafer 40 after the back grinding in device manufacturing has the optimal round chamfered shape, and is not likely to chip or crack, and greatly enhances the device manufacturing yield.

(Semiconductor Device Wafer 40)

Referring next to FIG. 4, the semiconductor device wafer 40 according to the invention is described.

As shown in FIG. 4, the semiconductor device wafer 40 according to the invention includes the back surface ground wafer 41, and the device structure layer 42 formed over the front surface of the back surface ground wafer 41.

This semiconductor device wafer 40 is manufactured by using the semiconductor wafer 10, 20, or 30, and is provided with a chamfer having a curvature radius of $R_d$ (µm) at a side surface 43 of the back surface ground wafer 41, in which the curvature radius $R_d$ of the chamfer satisfies $(1/2)t \leq R_d \leq (3/5)t$, where a thickness of the back surface ground wafer 41 is t (µm).

The semiconductor device wafer 40 having the aforementioned configuration can suppress the occurrence of cracking or chipping.

EXAMPLES

Example 1

Figure 5:
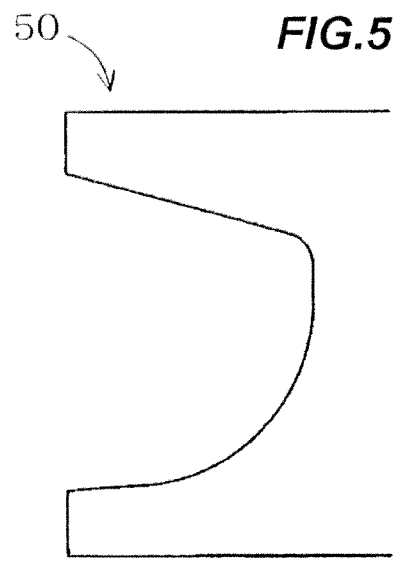
FIG. 5 is a schematic diagram showing a cross section of a grindstone for forming a chamfer in Example 1.
Figure 6:
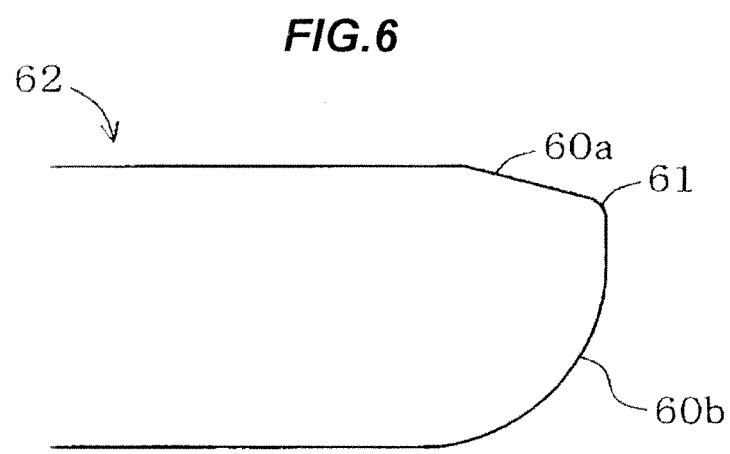
FIG. 6 is a schematic diagram showing a cross section of a wafer provided with a chamfer after chamfer formation in Example 1.

A GaAs single crystal ingot ground into a cylindrical shape with a diameter of 103 mm was sliced with a multi wire saw to provide a disc-shaped as-sliced wafer having a thickness of 800 µm. This as-sliced wafer was chamfered with a wafer end face grinder. The chamfering was performed as follows: First, using a grindstone 50 as shown in FIG. 5, the as-sliced wafer was ground to a diameter of 100 mm, and referring to FIG. 6, a front surface circumferential edge 60a of the as-sliced wafer was shaped into a flat chamfer having an angle of 15 degrees, and also a tip 61 thereof was shaped into a round chamfer having a curvature radius of 50 µm. At the same time, a back surface circumferential edge 60b of the as-sliced wafer was shaped into a round chamfer having a curvature radius of 800 µm. Then, at the same time, the as-sliced wafer was also provided with an orientation flat (OF) and an index flat (IF) for discriminating between the front surface and the back surface thereof in specified surface orientations, respectively, to provide a wafer 62 provided with the 15 degree flat chamfer and the 800 µm round chamfer.

Figure 7:
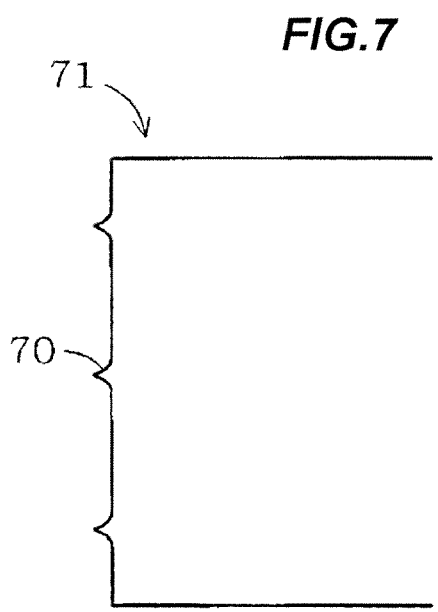
FIG. 7 is a schematic diagram showing a cross section of a grindstone for forming a groove in Example 1.

Following that, using a grindstone 71 with 50 µm high protrusions 70 as shown in FIG. 7, and adjusting height thereof to a position (=100 µm+wafer front surface amount to be ground) from the front surface of the chamfered wafer 62 at which position the protrusions 70 of the grindstone 71 contact the chamfered wafer 62, the chamfered wafer 62 was provided with an anti-cracking and chipping groove 81 as shown in FIG. 8, in a circumferential direction of an end face 80 thereof and around one circumference of the end face 80. Although the grindstone 71 is shown in FIG. 7 as having the three identically shaped protrusions 70, the grindstone 71 may naturally have one protrusion. Also, the grindstone 71 may be provided with three protrusions different in height. For example, with the different protrusions, the anti-cracking and chipping groove 81 may be formed to be gradually deeper. Similarly, the OF and IF portions were provided with the anti-cracking and chipping groove 81. Each of chamfers around boundaries 82a and 82b, respectively, between the anti-cracking and chipping groove 81 and the end face 80 of the chamfered wafer 62 was also then shaped into a round chamfer having a curvature radius of 50 μm, to provide a wafer 83 provided with the groove 81.

In a subsequent general polishing process, the front surface of the wafer 83 provided with the groove 81 was polished by 100 μm, and the back surface thereof is polished by 75 μm, so that a 625 μm thick semiconductor wafer 90 as shown in FIG. 9 was completed. Herein, both the front and back surfaces of the semiconductor wafer 90 were mirrored surfaces, but the back surface thereof may be a lapped surface or an etched surface. The vertical distance L from the front surface of the semiconductor wafer 90 to the wafer front surface boundary 82a between the anti-cracking and chipping groove 81 provided in the circumferential direction of the end face 80 and the end face 80 was then 100 μm.

Referring then to FIG. 10, in a device manufacturing process, a device structure layer 100 such as a semiconductor epitaxial layer was formed over the front surface of the semiconductor wafer 90. Finally, the semiconductor wafer 90 was back surface ground until the semiconductor wafer 90 has a thickness of 100 μm from its front surface, to provide a 100 μm thick semiconductor device wafer 103, in which the device structure layer 100 was formed over a back surface ground semiconductor wafer (back surface ground wafer) 101, and the 50 μm curvature radius round chamfers were shaped around a front surface circumferential edge 102a and a back surface circumferential edge 102b, respectively, of the back surface ground wafer 101. The occurrence of chipping, cracking or the like was successfully suppressed.

None of the ten wafers 101 manufactured and back surface ground in the same conditions as above chipped or cracked.

Example 2

A GaAs single crystal ingot ground into a cylindrical shape with a diameter of 155 mm was sliced with a multi wire saw, to provide a disc-shaped as-sliced wafer having a thickness of 900 μm. This as-sliced wafer was chamfered with wafer end face grinder. The chamfering was performed as follows: First, using a grindstone 112 with an 80 μm high protrusion 111 having a 280 μm flat portion 110 as shown in FIG. 11, the as-sliced wafer was ground to a diameter of 150 mm, and referring to FIG. 12, a front surface circumferential edge 120a of the as-sliced wafer was shaped into a flat chamfer having an angle of 15 degrees, and also a tip 121 thereof was shaped into a round chamfer having a curvature radius of 70 μm. At the same time, a back surface circumferential edge 120b of the as-sliced wafer was also shaped into a flat chamfer having an angle of 15 degrees, and also a tip 122 thereof was shaped into a round chamfer having a curvature radius of 150 μm. At the same time, with the protrusion 111, the as-sliced wafer was provided with an anti-cracking and chipping groove 124 in a circumferential direction of an end face 123 thereof and around one circumference of the end face 123. Then, using a notch grindstone also having an 80 μm high protrusion as in FIG. 11, the as-sliced wafer was provided with a notch in a specified surface orientation, and with the same anti-cracking and chipping groove 124 therein as the anti-cracking and chipping groove 124 formed in the circumferential direction of the as-sliced wafer. Each of chamfers around boundaries 125a and 125b, respectively, between the anti-cracking and chipping groove 124 and the end face 123 was also then shaped into a round chamfer having a curvature radius of 70 μm, to provide a wafer 126 provided with the groove 124.

In a subsequent general polishing process, the front surface of the wafer 126 provided with the groove 124 was polished by 100 μm, and the back surface thereof was polished by 75 μm, so that a 725 μm thick semiconductor wafer 130 as shown in FIG. 13 was completed. Herein, both the front and back surfaces of the semiconductor wafer 130 were mirrored surfaces, but the back surface thereof may be a lapped surface or an etched surface. The vertical distance L from the front surface of the semiconductor wafer 130 to the wafer front surface boundary 125a between the anti-cracking and chipping groove 124 provided in the circumferential direction of the end face 123 and the end face 123 was then 140 μm, and the length of a bottom 127 of the anti-cracking and chipping groove 124 was 280 μm.

Referring then to FIG. 14, in a device manufacturing process, a device structure layer 140 such as a semiconductor epitaxial layer was formed over the front surface of the semiconductor wafer 130. Finally, the semiconductor wafer 130 was back surface ground until the semiconductor wafer 130 has a thickness of 140 μm from its front surface, to provide a 140 μm thick semiconductor device wafer 143, in which the device structure layer 140 was formed over a back surface ground semiconductor wafer (back surface ground wafer) 141, and the 70 μm curvature radius round chamfers were shaped around a front surface circumferential edge 142a and a back surface circumferential edge 142b, respectively, of the back surface ground wafer 141. The occurrence of chipping, cracking or the like was successfully suppressed.

None of the ten wafers 141 manufactured and back surface ground in the same conditions as above chipped or cracked.

Example 3

Figure 16:
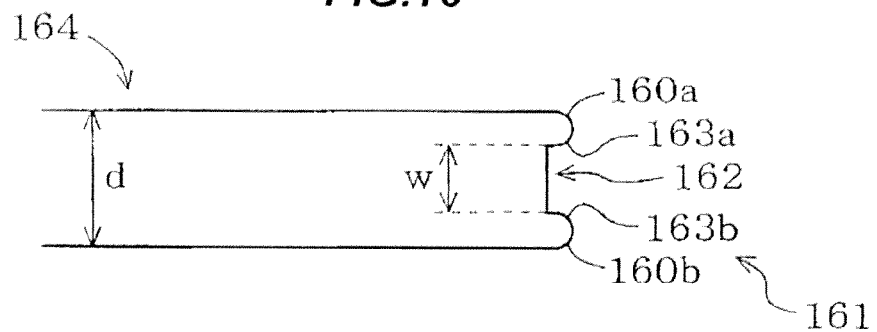
FIG. 16 is a schematic diagram showing a cross section of a double side ground semiconductor wafer in Example 3.

A 1000 μm thick GaN wafer grown by HVPE (Hydride Vapor Phase Epitaxy) was ground into a cylindrical shape with a diameter of 54 mm, to provide a disc-shaped as-sliced wafer. In a general polishing process, the front surface of that as-sliced wafer was polished by 300 μm, and the back surface thereof was polished by 300 μm, so that a 400 μm thick double side mirrored wafer was completed. This double side mirrored wafer was thereafter chamfered with a wafer end face grinder. The chamfering was performed as follows: First, using a grindstone 152 with a 50 μm high protrusion 151 having a 190 μm flat portion 150 as shown in FIG. 15, the double side mirrored wafer was ground to a diameter of 50.8 mm, and referring to FIG. 16, a front surface circumferential edge 160a and a back surface circumferential edge 160b of the double side mirrored wafer were each shaped into a round chamfer having a curvature radius of 50 μm. At the same time, with the protrusion 151, the double side mirrored wafer was provided with an anti-cracking and chipping groove 162 in a circumferential direction of an end face 161 thereof and around one circumference of the end face 161. Then, at the same time, the double side mirrored wafer was also provided with an OF and an IF for discriminating between the front surface and the back surface thereof in specified surface orientations, respectively, and with the same anti-cracking and chipping grooves 162 therein, respectively, as the anti-cracking and chipping groove 162 formed in the circumferential direction of the wafer. Each of chamfers around boundaries 163a and 163b, respectively, between the anti-cracking and chipping groove 162 and the end face 161 was also then shaped into a round chamfer having a curvature radius of 50 μm, to provide a semiconductor wafer 164 provided with the groove 162.

Figure 17:
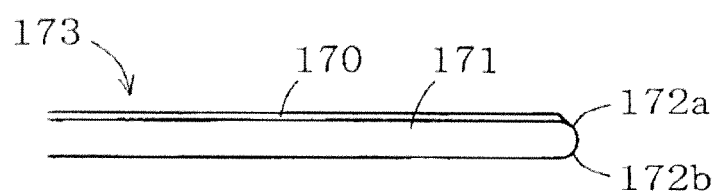
FIG. 17 is a schematic diagram showing a cross section of a back surface ground semiconductor device wafer during device manufacturing in Example 3.

Referring then to FIG. 17, in a device manufacturing process, a device structure layer 170 such as a semiconductor epitaxial layer was formed over the front surface of the semiconductor wafer 164. Finally, the semiconductor wafer 164 was back surface ground until the semiconductor wafer 164 has a thickness of 100 μm from its front surface, to provide a 100 μm thick semiconductor device wafer 173, in which the device structure layer 170 was formed over a back surface ground semiconductor wafer (back surface ground wafer) 171, and the 50 μm curvature radius round chamfers were shaped around a front surface circumferential edge 172a and a back surface circumferential edge 172b, respectively, of the back surface ground wafer 171. The occurrence of chipping, cracking or the like was successfully suppressed.

None of the ten wafers 171 manufactured and back surface ground in the same conditions as above chipped or cracked.

Comparative Example 1

Figure 18:
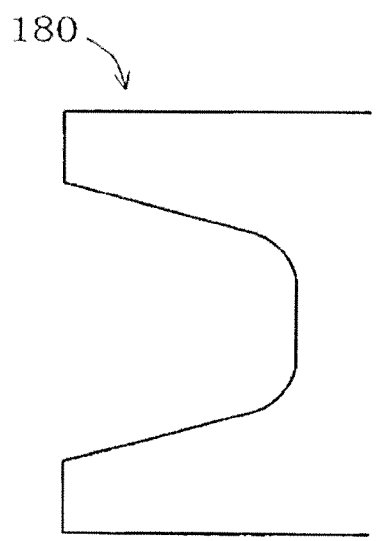
FIG. 18 is a schematic diagram showing a cross section of a grindstone for forming a chamfer in Comparative example 1.
Figure 19:
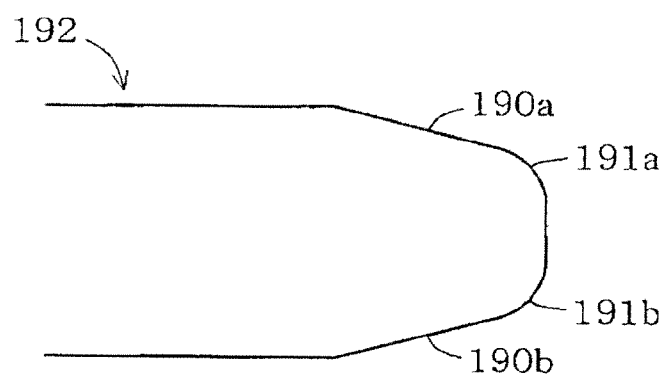
FIG. 19 is a schematic diagram showing a cross section of a wafer provided with a chamfer after chamfer formation in Comparative example 1.

A GaAs single crystal ingot ground into a cylindrical shape with a diameter of 103 mm was sliced with a multi wire saw, to provide a disc-shaped as-sliced wafer having a thickness of 800 μm. This as-sliced wafer was chamfered with a wafer end face grinder. The chamfering was performed as follows. First, using a grindstone 180 as shown in FIG. 18, the as-sliced wafer was ground to a diameter of 100 mm, and referring to FIG. 19, a front surface circumferential edge 190a and a back surface circumferential edge 190b of the as-sliced wafer were each shaped into a flat chamfer having an angle of 15 degrees, and also respective tips 191a and 191b thereof were each shaped into a round chamfer having a curvature radius of 50 μm. Then, at the same time, the as-sliced wafer was also provided with an OF and an IF for discriminating between the front surface and the back surface thereof in specified surface orientations, respectively. The chamfering was thereafter finished without forming the anti-cracking and chipping groove 81, 124, or 162 as in Examples 1 to 3, to provide a wafer 192 provided with the 15 degree chamfers and the 50 μm round chamfers.

Figure 20:
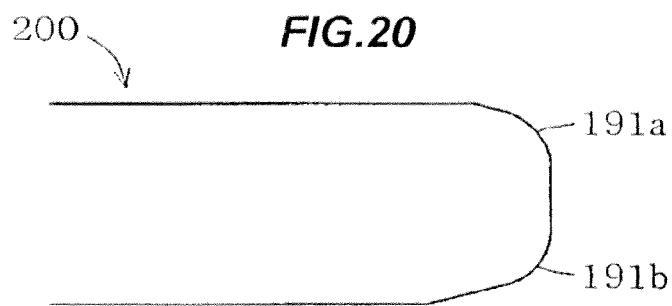
FIG. 20 is a schematic diagram showing a cross section of a double side ground semiconductor wafer in Comparative example 1.

In a subsequent general polishing process, the front surface of the chamfered wafer 192 was polished by 100 μm, and the back surface thereof was polished by 75 μm, so that a 625 μm thick semiconductor wafer 200 as shown in FIG. 20 was completed. Herein, both the front and back surfaces of the semiconductor wafer 200 were mirrored surfaces, but the back surface thereof may be a lapped surface or an etched surface.

Figure 21:
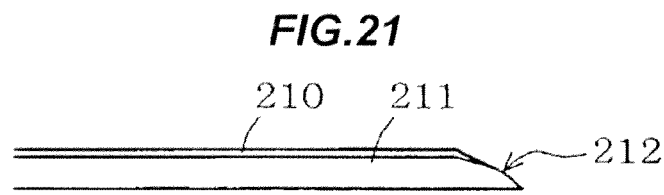
FIG. 21 is a schematic diagram showing a cross section of a back surface ground semiconductor device wafer during device manufacturing in Comparative example 1.
Figure 22:
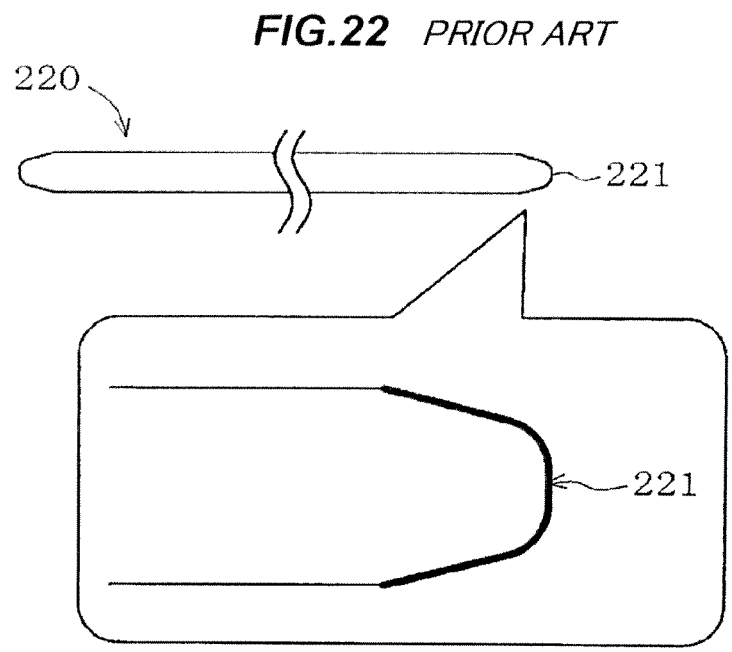
FIG. 22 is a schematic diagram showing a cross section of a conventional general semiconductor wafer and an enlarged view thereof.
Figure 23:
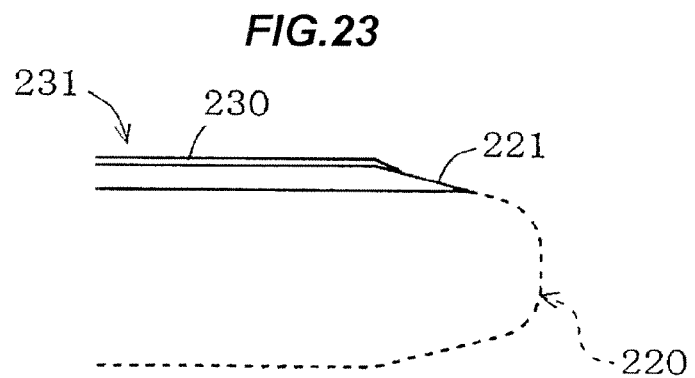
FIG. 23 is a schematic diagram showing a cross section of a back surface ground semiconductor device wafer during device manufacturing using the semiconductor wafer of FIG. 22, in which a portion indicated by a dotted line shows a portion to be removed by back grinding.

Referring then to FIG. 21, in a device manufacturing process, a device structure layer 210 such as a semiconductor epitaxial layer was formed over the front surface of the semiconductor wafer 200. Finally, the semiconductor wafer 200 was back surface ground until the semiconductor wafer 200 has a thickness of 100 μm from its front surface, to provide a back surface ground semiconductor wafer (back surface ground wafer) 211 in which the device structure layer 210 was formed over the semiconductor wafer 200 and an end face 212 of the back surface ground wafer 211 had an acute angle shape. The chipping occurred during a subsequent process.

Ten wafers 211 were manufactured and back surface ground in the same conditions as above. As a result, three of ten wafers chipped, and one of ten wafers cracked.

From the above examples, the advantages of the invention are confirmed.

Although here is described the semiconductor wafer 90, 130, 164, or 200 manufactured from the GaAs single crystal ingot or the GaN wafer, the same effects as described above can be expected in semiconductor wafers that are to be back surface ground in the device manufacturing, such as Si, GaAs, GaN, AlN, GaP, InP, InSb, InAs, SiC, and sapphire.

Also, although the effective chamfer shape according to the invention is considered to be round, the same effects as described above can be expected by adjusting the chamfer angle or the number of chamfering process in the case of using the round chamfering in combination with flat chamfering, or only flat chamfering.

Also, although the wafer end face grinder is used in the method of forming the anti-cracking and chipping groove 81, 124, or 162, it will be possible to substitute the wafer end face grinder with e.g. a laser beam machine. Also, the device structure layer 100, 140, or 170 may be provided by ion implantation or the like.

Example 4

Semiconductor device wafers were manufactured by using the methods described in Examples 1 to 3, and altering parameters t(μm) and $R_d$ (μm) (see FIG. 4), where t (μm) is the thickness of the back surface ground wafer 101, 141, or 171 and $R_d$ (μm) is the side surface curvature radius thereof.

As a result, the semiconductor device wafers can be manufactured without cracking or chipping, when manufactured so that the thickness t of the back surface ground wafer 101, 141, or 171 falls within a range of not less than 40 μm and not more than 200 μm, and the side surface curvature radius $R_d$ thereof falls within a range of not less than 20 μm and not more than 100 μm, and satisfies $(1/2)t \leq R_d \leq (3/5)t$.

It is found from the above results that the occurrence of cracking or chipping can be suppressed by the semiconductor device wafer having $(1/2)t \leq R_d \leq (3/5)t$ when provided with the chamfer having the curvature radius of $R_d$ (μm) at the side surface of the back surface ground wafer, and when the thickness of the back surface ground wafer is set at t (μm).

Modification to Example 4

In Example 4, the semiconductor device wafer was manufactured to have the end face shape of the back surface ground wafer satisfying $(1/2)t \leq R_d \leq (3/5)t$. However, a flat surface (or an end face having a curvature radius larger than the curvature radius of the chamfered boundaries) may be used in a portion of the wafer end face. For example, the flat surface may be provided between the front surface and back surface chamfered boundaries. In this case, the curvature radius $R_d$ of the chamfered boundary surfaces may be $(1/10)t \leq R_d \leq (1/2)t$.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A semiconductor wafer having a disc shape, comprising:
   chamfers provided around a circumferential edge of the wafer;
   an anti-cracking and chipping groove provided in one or more areas around one circumference of an end face of the wafer along a circumferential direction of the end face, wherein the chamfers include round chamfers provided around boundaries, respectively, between the anti-cracking and chipping groove and the end face of the wafer,
wherein each of the round chamfers has a curvature radius of not less than 20 μm and not more than 100 μm, and
wherein a depth of the anti-cracking and chipping groove is not less than 20 μm and not more than 200 μm.

2. The semiconductor wafer having a disc shape according to claim 1, wherein the anti-cracking and chipping groove is configured to prevent cracking or chipping of the end face in back grinding.

3. The semiconductor wafer according to claim 1, wherein the chamfers provided around the circumferential edge of the wafer further include a front surface chamfer provided around a front surface circumferential edge of the wafer, and
wherein the front surface chamfer has a curvature radius of not less than 20 μm and not more than 100 μm.

4. The semiconductor wafer according to claim 1, wherein the chamfers provided around the circumferential edge of the wafer further include a chamfer formed around a back surface circumferential edge of the wafer, and the chamfer provided around the back surface circumferential edge of the wafer includes a round chamfer having a curvature radius of not less than 20 μm and not more than 1000 μm.

5. The semiconductor wafer according to claim 1, wherein the anti-cracking and chipping groove in an area adjacent to a front surface of the wafer is located at a position where a wafer front surface boundary between the anti-cracking and chipping groove and the end face of the wafer becomes a wafer back surface circumferential edge after back grinding.

6. The semiconductor wafer according to claim 5, wherein the anti-cracking and chipping groove in the area adjacent to the front surface of the wafer is located at a position where a thickness of the wafer after the back grinding is not less than 40 μm and not more than 200 μm.

7. A semiconductor device wafer, comprising:
a semiconductor wafer including a front surface, a back surface, and a side surface, the back surface of the semiconductor wafer being ground;
a device structure layer provided over the front surface of the back surface ground semiconductor wafer,
wherein the side surface of the back surface ground semiconductor wafer is provided with a chamfer having a curvature radius of $R_d$ (μm) satisfying $(1/2)t \leq R_d \leq (3/5)t$, where a thickness of the back surface ground semiconductor wafer is t (μm);
an anti-cracking and chipping groove provided in at least one area around a circumference of an end face of the semiconductor wafer along a circumferential direction of the end face; and
round chamfers provided around boundaries, respectively, between the anti-cracking and chipping groove and the end face of the semiconductor wafer.

8. A semiconductor device wafer, comprising:
a semiconductor wafer including a front surface, a back surface, and a side surface, the back surface of the semiconductor wafer being ground;
a device structure layer provided over the front surface of the back surface ground semiconductor wafer,
wherein the side surface of the back surface ground semiconductor wafer includes a front surface boundary with a first chamfer, a back surface boundary with a second chamfer, and an end provided between the front surface boundary and the back surface boundary, and
wherein the first chamfer and the second chamfer have a curvature radius of $R_d$(μm) satisfying $(1/10)t \leq R_d \leq (1/2)t$, where a thickness of the back surface ground semiconductor wafer is t (μm), and the end has a curvature radius larger than the $R_d$ (μm);
an anti-cracking and chipping groove provided in at least one area around a circumference of an end face of the semiconductor wafer along a circumferential direction of the end face; and
round chamfers provided around boundaries, respectively, between the anti-cracking and chipping groove and the end face of the semiconductor wafer.

9. The semiconductor wafer according to claim 1, wherein the anti-cracking and chipping groove is located at a position where a boundary between the anti-cracking and chipping groove and the end face of the wafer becomes a back surface circumferential edge of the semiconductor device wafer.

10. The semiconductor wafer according to claim 1, wherein each of the round chamfers provided around boundaries extends with a round profile from a bottom of said each of the round chamfers to the end face of the semiconductor wafer.

11. The semiconductor wafer according to claim 6, wherein a side surface curvature radius $R_d$ of one of the chamfers provided around the circumferential edge of the wafer satisfies $(1/2)t \leq R_d \leq (3/5)t$, where t denotes the thickness of the wafer after the back grinding.

12. The semiconductor device wafer according to claim 7, wherein the anti-cracking and chipping groove in an area adjacent to the front surface of the semiconductor wafer is formed at a position where a boundary between the anti-cracking and chipping groove and the end face of the semiconductor wafer becomes a back surface circumferential edge of the semiconductor device wafer.

13. The semiconductor device wafer according to claim 7, wherein the chamfer provided in the side surface of the back surface ground semiconductor wafer comprises a round chamfer.

14. The semiconductor device wafer according to claim 7, wherein each of the round chamfers provided around the boundaries extends with a round profile from a bottom of said each of the round chamfers to the end face of the semiconductor wafer.

15. The semiconductor device wafer according to claim 8, wherein the anti-cracking and chipping groove in an area adjacent to the front surface of the semiconductor wafer is formed at a position where a boundary between the anti-cracking and chipping groove and the end face of the semiconductor wafer becomes a back surface circumferential edge of the semiconductor device wafer.

16. The semiconductor device wafer according to claim 8, wherein at least one of the first chamfer and the second chamfer comprises a round chamfer.

17. The semiconductor device wafer according to claim 8, wherein each of the round chamfers provided around the boundaries extends with a round profile from a bottom of said each of the round chamfers to the end face of the semiconductor wafer.

* * * * *